United States Patent
Hong

[11] Patent Number: 5,843,826
[45] Date of Patent: Dec. 1, 1998

[54] DEEP SUBMICRON MOSFET DEVICE

[75] Inventor: Gary Hong, Hsin-Chu, Taiwan

[73] Assignee: United Microeletronics Corp., Taiwan

[21] Appl. No.: 924,431

[22] Filed: Aug. 27, 1997

Related U.S. Application Data

[60] Provisional application No. 60/048,409 Jun. 3, 1997.
[51] Int. Cl.[6] ............... H01L 21/334; H01L 21/302; H01L 21/461
[52] U.S. Cl. .................. 438/300; 438/305; 438/692
[58] Field of Search ...................... 438/300, 305, 438/692

[56] References Cited

U.S. PATENT DOCUMENTS

| | | |
|---|---|---|
| 5,198,378 | 3/1993 | Rodder et al. . |
| 5,385,857 | 1/1995 | Solo De Zaldivar . |
| 5,496,750 | 3/1996 | Moslehi . |
| 5,580,906 | 12/1996 | Chang et al. . |
| 5,663,103 | 9/1997 | Iwasa et al. ............... 438/301 |
| 5,668,027 | 9/1997 | Hashimoto ............... 438/305 |
| 5,683,924 | 11/1997 | Chan et al. . |
| 5,733,709 | 3/1998 | Prall ............... 438/300 |

Primary Examiner—David Graybill
Assistant Examiner—Josetta I. Jones
Attorney, Agent, or Firm—Rabin & Champagne, P.C.

[57] ABSTRACT

A FET is formed that occupies a reduced surface area on a substrate because it incorporates elevated source/drain contacts provided at least partially over the field oxide regions. A silicon nitride mask is formed over the substrate and the mask is used for defining field oxide regions. Trenches are etched on either side of the mask and then thermal oxidation grows field oxide regions in the trenches so that the surface of the field oxide regions are approximately even with the original surface of the substrate. With the silicon nitride mask still in place, polysilicon is deposited over the substrate. The device is then planarized to remove the polysilicon from surfaces of the substrate, exposing the surface of the mask and leaving polysilicon structures on the field oxide regions on either side of mask. The mask is stripped and a layer of silicon is deposited over the polysilicon structures and on the active device region of the substrate, where the deposited silicon is epitaxial. A gate oxide layer is formed by oxidation of the epitaxial silicon and then a gate electrode is formed. The gate electrode can be spaced closer to the field oxide regions than is typically possible because contacts to the source/drain regions of the FET are formed through the first and second conductive structures.

12 Claims, 3 Drawing Sheets

DEEP SUBMICRON MOSFET DEVICE

This application claims priority from provisional application Ser. No. 60/048,409, filed Jun. 3, 1997.

BACKGROUND OF THE INVENTION

1. Field of the Invention

This invention relates to reduced dimension MOS field effect transistors and to the formation of such reduced dimension field effect transistors.

2. Description of the Related Art

Field effect transistors, generally referred to as FETs or MOSFETs, are the most common devices in modern integrated circuit devices. A common configuration of a FET is illustrated in FIG. 1. Field isolation regions 12 are formed at the surface of a substrate 10, defining the active device regions and providing lateral isolation between adjacent devices formed in and on the surface of the substrate 10. The illustrated field isolation regions are formed using the local oxidation of silicon (LOCOS) method. A gate oxide layer for the FET covers the active device regions of the substrate 10 and a gate electrode 16 of doped polysilicon is formed on the gate oxide layer 14. Oxide spacer structures 18 may be provided on either side of the gate electrode 16. The inner edges of source/drain regions 20 define a channel region at the surface of the substrate, with a source/drain region extending from either side of the gate electrode 16 to the field isolation regions 12. Frequently, the source/drain regions 20 have a lightly doped drain (LDD) structure in which an inner, more lightly doped portion of the source/drain region is aligned with the edge of the gate electrode 16, and a more heavily doped portion of the source/drain region 20 is aligned with the oxide spacer structure 18.

Generally, the FET structure shown in FIG. 1 is prepared by first forming a field isolation mask on the surface of the substrate 10, with openings in the mask exposing the substrate over regions where the field isolation structures will be formed. The field isolation structures are then formed either using a local oxidation of silicon (LOCOS) process, as illustrated, or using a modified LOCOS process or a shallow trench isolation method. The field isolation mask is then stripped and various implantations may be made into the active regions of substrate 10 to adjust the doping profile of the substrate within the active regions. A gate oxide layer 14 is then grown on the cleaned surfaces of the active regions of the substrate 10. Polysilicon is blanket deposited by a low pressure chemical vapor deposition (LPCVD) technique over the gate oxide layer and the field isolation regions. The polysilicon layer is doped, typically by ion implantation, and then photolithography is used to define gate electrodes 16 over the active regions. The source/drain regions 20 are formed in a two-stage implantation process. A first ion implantation is made using the gate electrode and the field isolation regions to mask the substrate, forming the more lightly doped portions of the LDD source/drain regions 20. A layer of CVD oxide is deposited onto the gate electrodes extending over the surface of the device and then an etch back process is used to form spacer structures 18 on either side of the gate electrode 16. A second ion implantation is performed to a dosage higher than the first implantation, forming a more heavily doped region aligned to the oxide spacer structures 18 and completing the source/drain regions 20.

Improvements in device density and reductions in the cost of manufacturing integrated circuits are closely linked to reducing the size of devices within those circuits. The width of gate electrode 16, as well as the size of other device structures, are determined by conventional lithography processes. In addition to limiting the size of the gate electrode, limitations on lithography set a lower limit on how small the source/drain regions can be made while still effectively functioning to provide contacts to the MOSFET. In most integrated circuit devices made up of MOSFETs, contact vias must be opened that expose the surface of the source/drain regions and then vertical interconnects are formed to connect the source/drain regions to other parts of the circuit. To account for misalignment and because of limitations imposed by lithography on the contact via formation process, the source/drain regions must each be made larger than a minimum size in the FIG. 1 MOSFET design. Shrinking the size of the MOSFET shown in FIG. 1 generally cannot proceed beyond the resolution and alignment limitations of the particular process technology used in forming the FIG. 1 device. Adoption of higher resolution lithography techniques, which could facilitate forming smaller electrodes and source/drain contact regions, is very expensive, and may only be economically justified for very high volume manufacturing. Smaller volume manufacturing operations and specialty or low-profit margin circuits might not cost effectively implement such high cost processes. Thus, even with the introduction of higher resolution lithography techniques, it may be difficult to further reduce the size of the FIG. 1 MOSFET.

SUMMARY OF THE PREFERRED EMBODIMENTS

It is therefore an object of the present invention to provide smaller FET devices having source/drain regions that consume less area on the surface of a substrate.

Aspects of the present invention provide a method of forming an integrated circuit device on a substrate having first and second insulating device isolation structures on a surface of the substrate. A portion of the surface of the substrate between the first and second insulating device isolation structures provides at least a portion of an active device region for the integrated circuit device. First and second conductive structures are formed on the corresponding first and second device isolation structures. A conductive layer comprising silicon is deposited over the active device region and connecting the first and second conductive structures to portions of the active device regions. A gate oxide layer and a gate electrode are formed on the silicon over the active device region, with the gate electrode positioned at least partially between the first and second conductive structures. First and second source/drain regions are formed at least partially within the layer of silicon over the active device region, the first and second conductive structures electrically connected to and providing contacts for the respective first and second source/drain regions.

DETAILED DESCRIPTION OF THE PREFERRED EMBODIMENTS

In accordance with one aspect of the present invention, a FET is formed having elevated source/drain regions formed partially above the device isolation structures of the integrated circuit device. Because the elevated source/drain regions provide enlarged contacts to the portions of the source/drain regions formed in the substrate, the portions of the source/drain regions to be formed in the substrate can be made smaller. Edges of the gate electrode can be spaced closer to the edges of the device isolation region than is conventionally possible. In some integrated circuits, the surface of the device isolation regions, as well as the space immediately above the device isolation regions, are not used for circuitry within the integrated circuit device. Practice of preferred embodiments of the present invention in such structures therefore allows improved levels of device integration, without using smaller design rules. Two aspects of preferred embodiments of the present invention are particularly advantageous for forming a reduced dimension FET. First, the elevated source/drain contacts are formed self-aligned to the device isolation structures and to the active device region defined between the device isolation structures, which facilitates manufacture of the device. Secondly, connections between the elevated source/drain contacts and the source/drain regions are made through a layer of silicon deposited over the substrate so as to be epitaxial to the active device regions on the substrate.

Particularly preferred embodiments of the present invention form FETs that occupy a reduced surface area on a substrate by incorporating elevated source/drain contacts formed at least partially over the field oxide regions of the integrated circuit. A silicon nitride mask is formed over the substrate and the mask is used for defining field oxide regions. Trenches are etched on either side of the mask and then thermal oxidation grows field oxide regions in the trenches so that the surface of the field oxide regions are approximately even with the original surface of the substrate. With the silicon nitride mask still in place, polysilicon is deposited over the substrate. The device is then planarized to remove the polysilicon from surfaces of the substrate, exposing the surface of the mask and leaving polysilicon structures on the field oxide regions on either side of the mask. The mask is stripped and a layer of silicon is deposited over the polysilicon structures and on the active device region of the substrate, where the deposited silicon is epitaxial to the substrate. A gate oxide layer is formed by oxidation of the epitaxial silicon and then a gate electrode is formed. The gate electrode can be spaced closer to the field oxide regions than is typically possible because contacts to the source/drain regions of the FET are formed through the first and second conductive structures.

Figure 1:
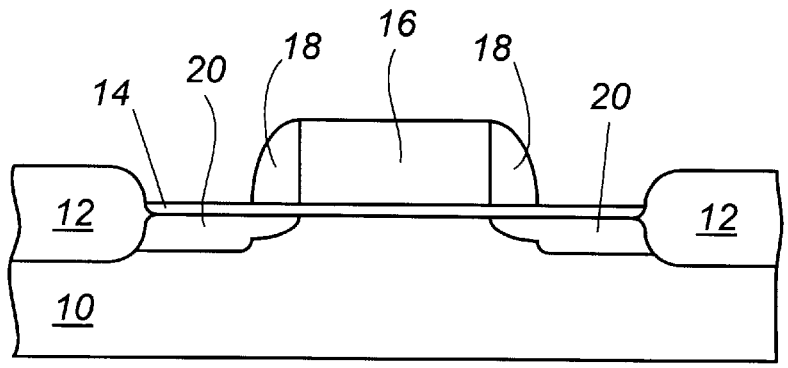
FIG. 1 illustrates a conventional MOSFET structure.
Figure 2:
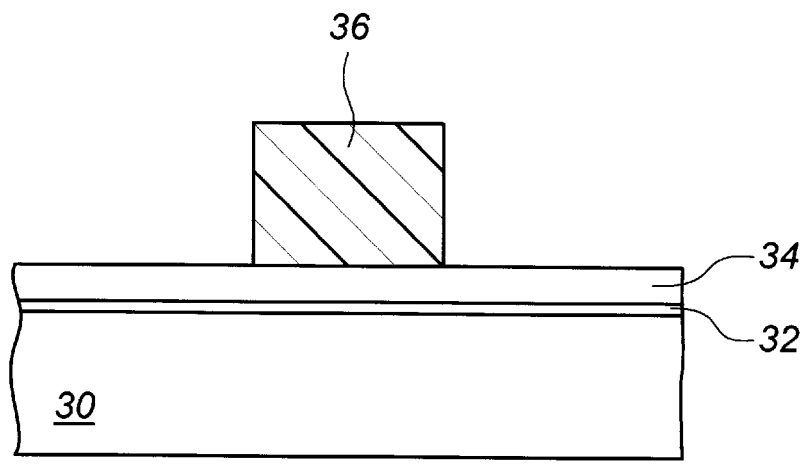
FIGS. 2–9 illustrate steps in the manufacture of a MOSFET in accordance with preferred embodiments of the present invention.

These and other aspects of the present invention are now described in further detail with reference to FIGS. 2–9. The following description will be made in terms of an NMOS device, although those of ordinary skill will appreciate that the present invention can readily be applied to the formation of PMOS devices. FIG. 2 shows a substrate 30 which has at least a surface layer with a P-type background doping. There are embodiments of the invention in which the epitaxial silicon layer formed over the active device region of the substrate might be sufficiently thick that the conductivity type of the channel of the FET could be selected independently of the conductivity type of the substrate 30. At of the substrate is covered by a pad oxide layer 32 to protect the surface of the substrate during subsequent processing. Pad oxide layer 32 may be formed by thermal oxidation to a thickness of between about 50–200 Å, or whatever thickness is appropriate to protect the surface of the substrate from thermal stresses generated by the mask used to form the field oxide regions.

A layer of masking material 34 is provided over the surface of the pad oxide layer 32. The masking material will be used in forming field oxide regions or other insulating device isolation structures on the substrate and, in particularly preferred embodiments, will be used in the process of defining the elevated polysilicon conductors that provide source/drain contacts in accordance with preferred embodiments of the present invention. As such, the thickness of the masking layer 34 might be selected to set the thickness of the elevated polysilicon conductors to be formed and the material chosen for the masking layer 34 might be selected to facilitate the use of the mask formed from the masking layer 34 in defining the elevated polysilicon conductors. At a minimum, the masking layer should be formed from a material different from polysilicon and preferably the material should be a comparatively hard material useful as a polish stop. These various functions of the masking material are accommodated by forming the masking layer 34 as CVD silicon nitride deposited to a thickness of approximately 300–2000 Å.

Figure 3:
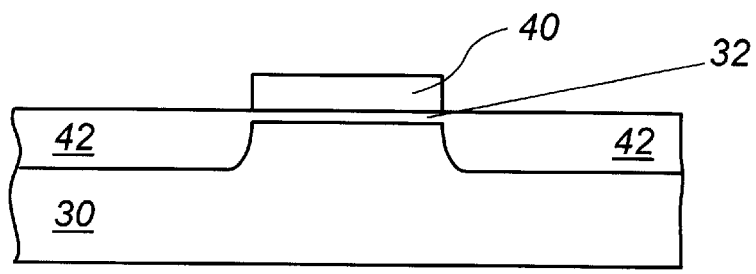

A photoresist mask 36 is provided by conventional photolithography on the layer of masking material 34, covering the portion of the masking layer 34 that will be left as a mask and exposing the portions of the masking layer 34 over where the device isolation regions are to be formed. A mask 40, shown in FIG. 3, is then defined from the masking layer 34 by etching using, for example, plasma etching with an etchant derived from an $SF_6$ source gas. The photoresist mask 36 is then removed by ashing and trenches are defined on either side of the mask 40. The trenches may be defined by etching first through the pad oxide layer 32 using, for example, plasma etching with an etchant derived from a $C_2F_6$ source gas and then etching into the substrate using, for example, plasma etching with an etchant derived from HBr and HCl source gases. Typically, the trench etch process is facilitated by the use of the silicon nitride hard mask 40 shown in FIG. 3. Field oxide regions 42 are then formed in a thermal oxidation process in the manner associated with the local oxidation of silicon (LOCOS) process. Most preferably, the silicon nitride mask 40 is left in place after its use as an etch mask and through the process of growing the field oxide regions 42 to help confine the thermal oxidation process. The thermal oxidation process preferably used to define the device isolation regions also serves to define the active device region of the substrate beneath the mask 40.

Figure 4:
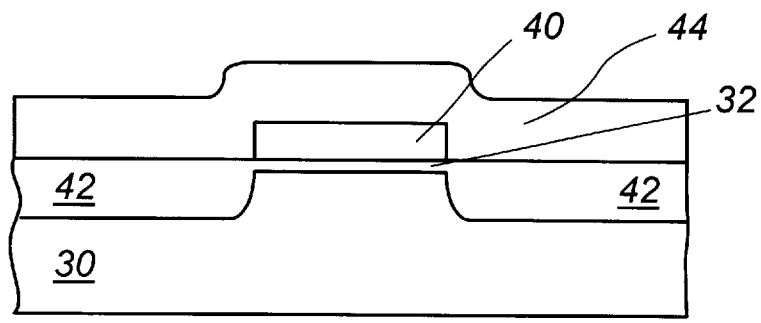
Figure 5:
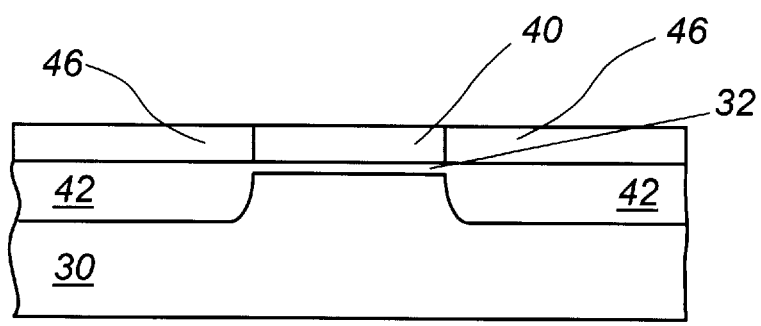

Next, the elevated polysilicon structures that serve as source/drain contacts for preferred embodiments of the present invention are formed. Again, it is preferred that the silicon nitride mask 40 be left in place, along with the portion of the pad oxide layer 32, over the active device region of the substrate. A layer of polysilicon 44 is then deposited over the surfaces of the field oxide regions 42 and over the surface of the silicon nitride mask 40, as shown in FIG. 4. The polysilicon layer 44 is preferably deposited to a thickness of between about 500–5000 Å using the conventional polysilicon low pressure chemical vapor deposition (LPCVD) process. The polysilicon layer 44 may be doped in situ during deposition or it might be doped by ion implantation and annealing, both of which processes are conventional. The elevated polysilicon structures are then laterally defined in part by a chemical mechanical polishing (CMP) process that stops on the surface of the mask 40, providing polysilicon layers 46 even with and extending from the mask 40, as shown in FIG. 5. This polysilicon planarization process might alternately be accomplished using a polysilicon etch back process.

Preferably, the surfaces of the polysilicon layers 46 are approximately at the surface of the mask 40, making the surface of the FIG. 5 device well suited to photolithography.

Figure 6:
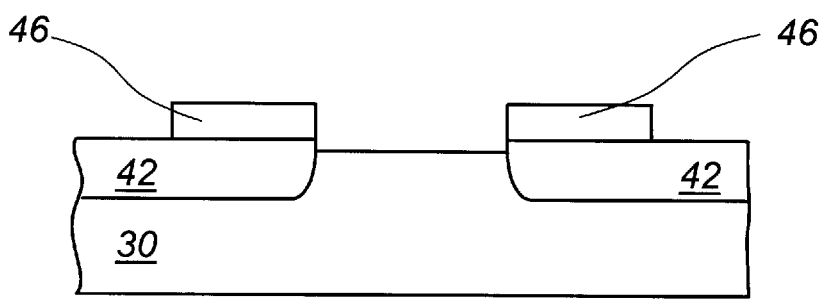
Figure 7:
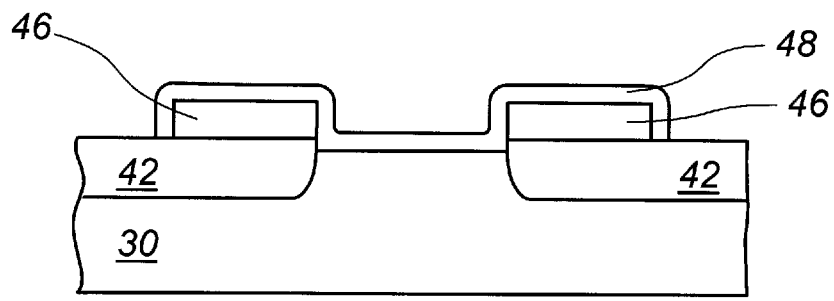
Figure 8:
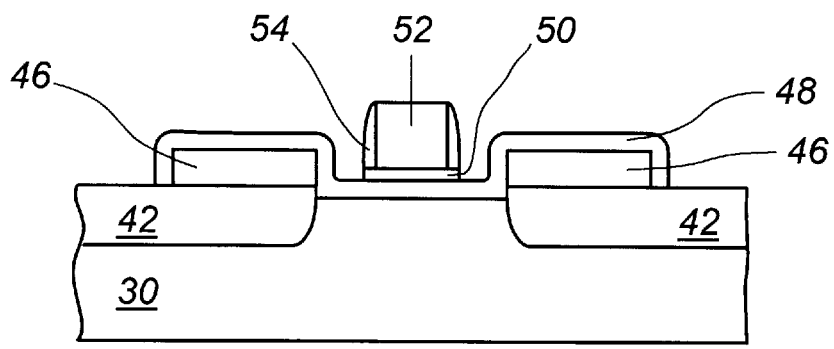
Figure 9:
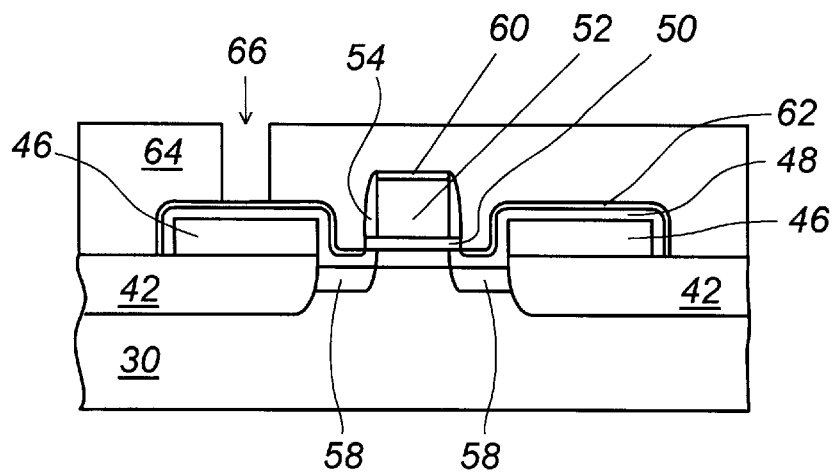

A conventional photolithography process is used to complete the lateral definition of the elevated polysilicon structures 46 shown in FIG. 6. Thus, a photoresist mask is formed on the FIG. 5 device, the polysilicon layers are etched, and the photoresist mask is removed by ashing to form the structure shown in FIG. 6, with the elevated polysilicon structures lying entirely above the field oxide regions 42. The mask 40 is then removed, typically by dry etching using an etchant derived in a plasma process from a fluorine bearing source gas and then the pad oxide layer 32 is removed from the surface of the active device region. The etchant used for removing the pad oxide layer might be generally similar to that used for removing the mask. If desired, an antipunchthrough implantation might be made into the active device region at this time.

Next, a layer of silicon 48 is deposited on the device of FIG. 6 by selective epitaxial silicon growth to provide a layer of conductive material over the elevated polysilicon structures and over the active device region of the substrate 30. Typically, selective epitaxial silicon growth is performed on a clean silicon surface in a low pressure (about 1 milliTorr) environment from a mixture of source gases including silane at a temperature (about 550°–600° C.) similar to that used for the LPCVD of polysilicon. The silicon layer 48 deposited in this fashion will be single crystalline and lattice matched with the substrate 30 over the active device region and will be polysilicon over the elevated polysilicon conductive structures 46. Preferably, the silicon layer 48 is doped to the same conductivity type as the substrate 30 (in this case P-type) during the selective epitaxial growth process by adding the appropriate dopant gas (here, borane) to the deposition environment. Silicon layer 48 is preferably grown to a thickness of approximately 300–2000 Å.

Further processing proceeds in a largely conventional manner. A gate oxide layer 50 is thermally grown on the silicon layer 48 to a thickness of approximately 30–150 Å. Polysilicon is deposited over the gate oxide layer 50, is doped in the conventional manner and the polysilicon is patterned to define the polysilicon portion 52 of gate electrode structures. Oxide spacers 54 are formed by depositing a layer of oxide by CVD over the structure and then etching back using plasma etching and a fluorine-based etchant. The spacers may be formed as part of the definition of LDD source/drain regions or, if a simpler source/drain structure is used, the spacers are nonetheless provided to protect the gate electrode and to facilitate the self-aligned formation of silicide layers on the source/drain regions and on the polysilicon gate electrode 52. Generally speaking, the spacer etch back process will remove the gate oxide layer 50 from other portions of the silicon layer 48 not covered by the spacers or gate electrode.

Source/drain regions 58 are formed in the substrate 30 by ion implantation self-aligned to the gate electrodes. If desired, an LDD structure can be made in the typical fashion. Importantly, the implantation and annealing of the source/drain regions 58 converts the silicon layer 48 to a relatively heavily doped N-type in those portions of the layer 48 not covered by the spacers 54 and gate electrode 52. The portion of the layer 48 under the spacers and gate electrode is the channel of the illustrated FET and remains P-type. A conventional self-aligned silicide ("salicide") process is used to form a titanium or other metal silicide layer 60 on the gate electrode and over the source/drain regions 58 and over the elevated polysilicon structures 46, 48 that provide the source/drain contacts 62 for the illustrated FET. Briefly, a layer of titanium is deposited to approximately 200–400 Å in thickness and the device is subjected to a first rapid thermal anneal at a temperature of less than 700° C. and preferably about 650° C. to form titanium silicide at the interfaces between the titanium layer and the exposed silicon surfaces. An etch is performed to remove the unreacted titanium, titanium nitride, titanium oxide and other undesired annealing byproducts. A wet etch is typically preferred and might include a heated solution of ammonia and hydrogen peroxide in water. After the wet etch removes the unreacted titanium and undesirable byproducts, the remaining titanium silicide is annealed at a temperature of at least 700° C. and more preferably about 750° C. to complete formation of the conductor structure.

Further processing continues to complete the integrated circuit device by integrating the FET with other structures formed on the substrate. Generally, a layer of insulating material 64 such as CVD oxide deposited from a TEOS source gas or a boron phosphorus silicate glass is provided over the FET. Contacts to the FET are formed by photolithography to provide a contact via 66 to expose the surface of the FET. Metallization is provided in the contact via in the typical manner to complete the device.

While the present invention has been described with particular emphasis on certain preferred embodiments thereof, the invention is not limited to these particular embodiments. Those of ordinary skill will appreciate that different implementations of this invention and alternated variations can be made, consistent with the teachings herein. Accordingly, the scope of the invention is to be determined by the claims which follow.

What is claimed:

1. A method of forming an integrated circuit device comprising the steps of:
   providing a substrate having first and second insulating device isolation structures on a surface of the substrate, a portion of the surface of the substrate between the first and second insulating device isolation structures providing at least a portion of an active device region for the integrated circuit device;
   forming first and second conductive structures on the corresponding first and second device isolation structures;
   depositing a layer of silicon material over the active device region and connecting the first and second conductive structures to portions of the active device region;
   forming a gate oxide layer and a gate electrode on the layer of silicon over the active device region, the gate electrode positioned at least partially between the first and second conductive structures; and
   forming first and second source/drain regions at least partially within the layer of silicon over the active device region, the first and second conductive structures electrically connected to and providing contacts for the respective first and second source/drain regions;
   wherein the device isolation structures are provided by forming a mask over the substrate and providing insulating device isolation regions aligned with first and second edges of the mask; and
   wherein the step of forming first and second conductive structures includes the steps of:
   depositing a polysilicon layer over surfaces of the first and second insulating device isolation regions and over the mask; and
   planarizing the polysilicon layer so that the polysilicon layer is removed from over the mask and first and second polysilicon structures extend over the first and second insulating device isolation structures on either side of the mask.

2. The method of claim 1, wherein the mask comprises silicon nitride and the polysilicon layer is planarized by chemical mechanical polishing.

3. The method of claim 2, wherein the first and second insulating device isolation structures are formed by forming trenches in the substrate on either side of the mask and filling the trenches with oxide.

4. The method of claim 3, wherein the trenches are filled by thermal oxidation.

5. The method of claim 3, wherein the trenches are formed by etching.

6. The method of claim 1, wherein the layer of silicon is provided in a selective epitaxial growth process.

7. The method of claim 6, wherein the layer of silicon comprises epitaxial silicon on the active device region and polysilicon deposited over the conductive structures.

8. The method of claim 7, wherein the gate oxide layer is grown by thermal oxidation of the epitaxial silicon.

9. The method of claim 6, wherein the layer of silicon is doped by ion implantation after the gate electrode is provided, so that portions of the conductive layer provided over the first and second conductive structures are comparatively heavily doped to a first conductivity type and a portion of the conductive layer provided under the gate electrode is comparatively lightly doped to a second conductivity type.

10. The method of claim 6, wherein portions of the layer of silicon in contact with the first and second conductive structures are converted to metal silicide while a portion of the layer of silicon over the active device region is not converted to a metal silicide.

11. The method of claim 10, wherein the metal silicide is titanium silicide.

12. The method of claim 1, further comprising the steps of:

depositing a layer of insulating material over the first and second conductive structures; and etching a contact opening through the layer of insulating material to expose a surface of the first conductive structure.

* * * * *